United States Patent
Deshpande et al.

(10) Patent No.: US 9,977,325 B2
(45) Date of Patent: May 22, 2018

(54) MODIFYING DESIGN LAYER OF INTEGRATED CIRCUIT (IC)

(71) Applicant: International Business Machines Corporation, Armonk, NY (US)

(72) Inventors: Veeresh V. Deshpande, Zurich (CH); Howard S. Landis, Essex Junction, VT (US); Arun Sankar Mampazhy, Kerala (IN); Neelima Mandloi, East Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 14/918,057

(22) Filed: Oct. 20, 2015

(65) Prior Publication Data

US 2017/0108769 A1   Apr. 20, 2017

(51) Int. Cl.
   *G03F 1/36* (2012.01)
   *G03F 7/20* (2006.01)
   *G06F 17/50* (2006.01)

(52) U.S. Cl.
   CPC ............ *G03F 1/36* (2013.01); *G03F 7/70441* (2013.01); *G06F 17/5081* (2013.01)

(58) Field of Classification Search
   CPC ..... G03F 1/36; G03F 7/70433; G06F 17/5081
   See application file for complete search history.

(56) References Cited

U.S. PATENT DOCUMENTS

| | | |
|---|---|---|
| 7,681,166 B2 | 3/2010 | van Adrichem et al. |
| 8,176,447 B2 | 5/2012 | Kumar et al. |
| 2010/0122231 A1* | 5/2010 | Agarwal ............... G03F 1/36 716/53 |
| 2013/0183832 A1 | 7/2013 | Landis |

* cited by examiner

*Primary Examiner* — Naum B Levin
(74) *Attorney, Agent, or Firm* — Steven J. Meyers; Hoffman Warnick LLC

(57) ABSTRACT

Various embodiments include approaches for modifying a design layer of an integrated circuit (IC). In some cases, an approach includes: identifying at least one empty region in a design layer used to form the IC; determining whether the at least one empty region requires a fill object; placing at least one fill object in the at least one empty region and tagging the at least one fill object in response to determining the at least one empty region requires a fill object; performing a simplified optical proximity correction (OPC) on the tagged at least one fill object and a complete OPC on the design layer; and generating a modified design layer including a corrected version of the design layer and modified fill objects after the performing of the simplified OPC on the tagged at least one fill object and the complete OPC on the design layer.

8 Claims, 11 Drawing Sheets

MODIFYING DESIGN LAYER OF INTEGRATED CIRCUIT (IC)

FIELD

The subject matter disclosed herein relates to integrated circuits (ICs). More particularly, the subject matter disclosed herein relates to designing and manufacturing ICs.

BACKGROUND

In a conventional process of forming a mask for a design layer of an integrated circuit (IC) having M original design features and N original dummy features, an OPC (Optical Proximity Correction) program is typically run on characteristic data sets of the M original design features, resulting in OPC-applied characteristic data sets of M OPC-applied design features. Next, the mask is formed from the OPC-applied characteristic data sets of the M OPC-applied design features, and the N dummy features. The next generation technologies will require OPC-applied dummy features as well, due to shrinking size of the dummy features. One simple procedure is to run an OPC program on the M original design features and the N original dummy features, resulting in OPC-applied mask of M OPC-applied design features and N OPC-applied dummy features. However, the numbers M and N are usually very large, and therefore, running an OPC program on both original design features and original dummy features together consumes a large amount of computational resources and time, and would not be a viable solution.

Design-fill shapes (or dummy features, used interchangeably herein) are used to fill empty spaces in IC design layouts in order to aid in formation of physical ICs from those layouts, e.g., in order to provide object density when a polishing process (e.g., chemical mechanical polishing, or CMP) is performed on a particular layer. It may be desirable to use design-fill shapes that match or nearly match design shapes from an OPC library in order to meet the process tolerance (e.g., CMP uniformity) requirements of next generation technologies. However, it may also be desirable to utilize design-fill shapes that have few polygon edges in order to reduce the time required to form masks which ultimately outline those shapes. Conventional approaches for forming design-fill shapes include iteratively and manually modifying OPC library shapes, using a rule based modification of design-fill shapes and/or removing edges after running OPC on the layout. These approaches can be time-consuming and inaccurate.

SUMMARY

Various embodiments include approaches for modifying a design layer of an integrated circuit (IC). In some cases, an approach includes: identifying at least one empty region in a design layer used to form the IC; determining whether the at least one empty region requires a fill object; placing at least one fill object in the at least one empty region and tagging the at least one fill object in response to determining the at least one empty region requires a fill object; performing a simplified optical proximity correction (OPC) on the tagged at least one fill object and a complete OPC on the design layer; and generating a modified design layer including a corrected version of the design layer and modified fill objects after the performing of the simplified OPC on the tagged at least one fill object and the complete OPC on the design layer.

A first aspect of the disclosure includes a system having: at least one computing device configured to modify a design layer of an integrated circuit (IC) by performing actions including: identifying at least one empty region in the design layer used to form the IC; determining whether the at least one empty region requires a fill object; placing at least one fill object in the at least one empty region and tagging the at least one fill object in response to determining the at least one empty region requires a fill object; performing a simplified optical proximity correction (OPC) on the tagged at least one fill object and a complete OPC on the design layer; and generating a modified design layer including a corrected version of the design layer and modified fill objects after the performing of the simplified OPC on the tagged at least one fill object and the complete OPC on the design layer.

A second aspect of the disclosure includes a computer program product having program code stored on a computer readable storage medium, which when executed by at least one computing device, causes the at least one computing device to modify a design layer of an integrated circuit (IC) by performing actions including: identifying at least one empty region in the design layer used to form the IC; determining whether the at least one empty region requires a fill object; identifying a first area of the design layer requiring a nested fill object and a second area of the design layer requiring a non-nested fill object in response to determining the at least one empty region requires the fill object; placing the nested fill object in the first area and the non-nested fill object in the second area; performing one of a simplified optical proximity correction (OPC) or no OPC on the nested fill object, and a complete OPC on the non-nested fill object and the design layer; and generating a modified design layer including a corrected version of the design layer and modified nested fill objects and non-nested fill objects after the performing of the simplified OPC or no OPC on the nested fill object and the complete OPC on the non-nested fill object and the design layer.

A third aspect of the disclosure includes a computer-implemented method of modifying a design layer of an integrated circuit (IC), the method comprising: identifying at least one empty region in the design layer used to form the IC; determining whether the at least one empty region requires a fill object; identifying a first area of the design layer requiring a nested fill object and a second area of the design layer requiring a non-nested fill object in response to determining the at least one empty region requires the fill object; placing the nested fill object in the first area and the non-nested fill object in the second area; performing a simplified optical proximity correction (OPC) on the non-nested fill object, either no OPC or the simplified OPC on the nested fill object, and a complete OPC on the design layer; and generating a modified design layer including a corrected version of the design layer and modified nested fill objects and non-nested fill objects after the performing of the simplified OPC on the non-nested fill object, the simplified OPC or no OPC on the nested fill object and the complete OPC the design layer.

BRIEF DESCRIPTION OF THE FIGURES

These and other features of this invention will be more readily understood from the following detailed description of the various aspects of the invention taken in conjunction with the accompanying drawings that depict various embodiments of the invention, in which.

Figure 1:
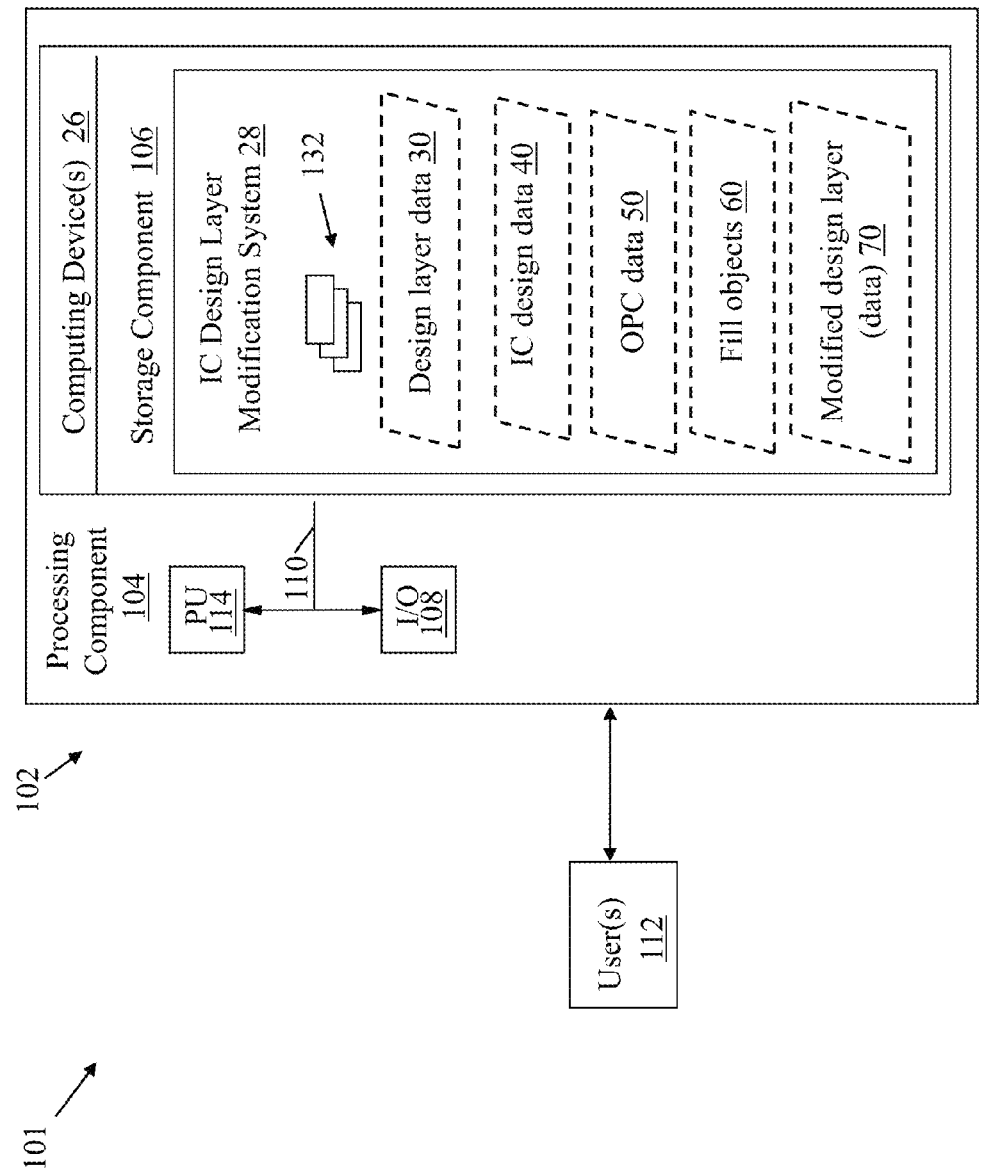
FIG. 1 shows an environment including a system for modifying a design layer of an integrated circuit (IC), according to various embodiments of the disclosure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As indicated above, the subject matter disclosed herein relates to integrated circuits (ICs). More particularly, the subject matter disclosed herein relates to designing and manufacturing ICs.

As noted herein, conventional approaches for forming design-fill shapes include iteratively modifying OPC library shapes, and removing edges after running OPC on the layout. These approaches can be time-consuming and inaccurate.

In contrast to conventional approaches, various aspects of the disclosure include systems, computer program products and associated methods for modifying a design layer of an IC to reduce processing time and simplify selection and implementation of fill objects.

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings.

FIG. 1 shows an illustrative environment 101 including an integrated circuit (IC) design layer modification system 28, for performing the functions described herein according to various embodiments of the disclosure. To this extent, the environment 101 includes a computer system 102 that can perform one or more processes described herein in order to modify a design layer (design layer data 30 representing a design layer, for example, an input design layer) of an integrated circuit (IC design data 40). In particular, the computer system 102 is shown as including the IC design layer modification system 28, which makes computer system 102 operable to modify a design layer (design layer data 30) by performing any/all of the processes described herein and implementing any/all of the embodiments described herein.

The computer system 102 is shown including a computing device 26, which can include a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the IC design layer modification system 28, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human and/or computerized user) 112 to interact with the computer system 102 and/or one or more communications devices to enable the system user 112 to communicate with the computer system 102 using any type of communications link. To this extent, the IC design layer modification system 28 can manage a set of interfaces (e.g., graphical user interface(s), application program interface, etc.) that enable human and/or system users 112 to interact with the IC design layer modification system 28. Further, the IC design layer modification system 28 can manage (e.g., store, retrieve, create, manipulate, organize, present, etc.) data, such as design layer data 30 (e.g., data describing one or more layers of an IC, including object (e.g., lines, vias, transistors) dimensions, spacings between objects, overlay and nesting effects between objects of distinct layers, etc.), IC design data 40 (e.g., data about a plurality of levels in an IC design representing a physical IC device, such as number of layers, inter-layer effects, etc.), optical proximity correction (OPC) data 50 (e.g., including information about optical proximity effects on one or more objects in design layer data 40 and IC design data 40, such as shape modifications using optical proximity correction to account for photolithography effects in manufacturing those objects, inter-layer effects and spacing effects related to OPC, etc.) and/or fill object (data) 60 (e.g., data representing fill objects(s) that can be utilized to fill spaces in design layer data 30 (and IC design data 4)) using any solution, e.g., via wireless and/or hardwired means.

In any event, the computer system 102 can comprise one or more general purpose computing devices capable of executing program code, such as the IC design layer modification system 28, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the IC design layer modification system 28 can be embodied as any combination of system software and/or application software. It is further understood that the IC design layer modification system 28 can be implemented in a cloud-based computing environment, where one or more processes are performed at distinct computing devices (e.g., a plurality of computing devices 26), where one or more of those distinct computing devices may contain only some of the components shown and described with respect to the computing device 26 of FIG. 1.

Further, the IC design layer modification system 28 can be implemented using a set of modules 132. In this case, a module 132 can enable the computer system 102 to perform a set of tasks used by the IC design layer modification system 28, and can be separately developed and/or implemented apart from other portions of the IC design layer modification system 28. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of IC design layer modification system 28 fixed thereon (e.g., one or more modules 132). However, it is understood that the computer system 102 and IC design layer modification system 28 are only representative of various possible equivalent computer systems that may perform a process described herein. To this extent, in other embodiments, the functionality provided by the computer system 102 and IC design layer modification system 28 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices 26, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

While shown and described herein as a method and system for modifying a design layer of an IC (e.g., design layer data 30) (FIG. 1), it is understood that aspects of the invention further provide various alternative embodiments. For example, in one embodiment, the invention provides a computer program fixed in at least one computer-readable medium, which when executed, enables a computer system to modify a design layer of an IC (e.g., an input design layer, represented by design layer data 30). To this extent, the computer-readable medium includes program code, such as the IC design layer modification system 28 (FIG. 1), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the IC design layer modification system 28 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of modifying a design layer of an IC (e.g., design layer data 30, FIG. 1). In this case, a computer system, such as the computer system 102 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

In any case, the technical effect of the various embodiments of the invention, including, e.g., the IC design layer modification system 28, is to modify a design layer of an IC (e.g., design layer data 30, such as an input design layer). It is understood that according to various embodiments, the IC design layer modification system 28 could be implemented modify a plurality of design layers of one or more ICs, as described herein.

Figure 2:
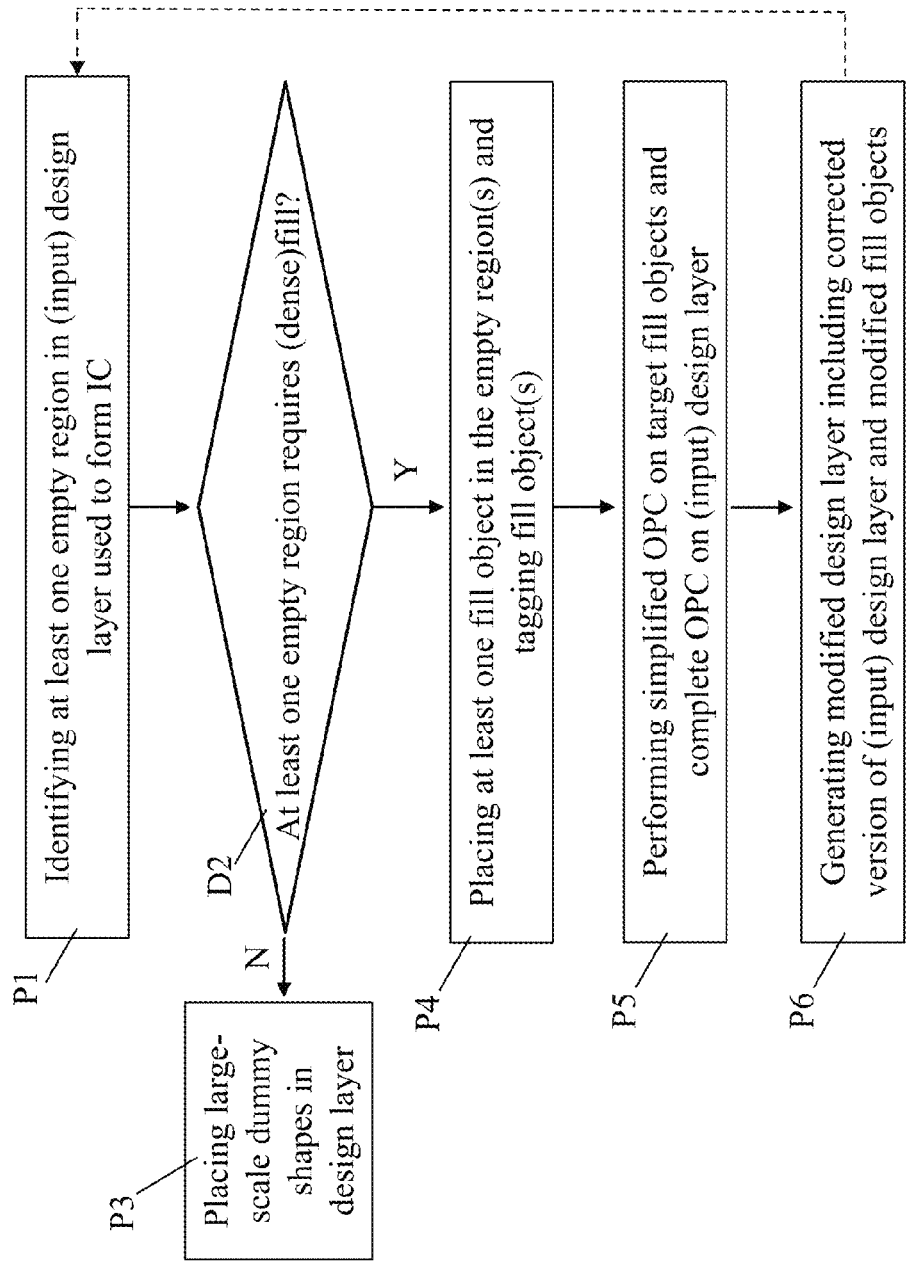
FIG. 2 shows a flow diagram illustrating a method performed according to particular embodiments of the disclosure.

FIG. 2 shows a flow diagram depicting processes in a method according to various embodiments. As shown, a process of modifying a design layer (design layer data 30, FIG. 1, representing an input design layer) can include:

Process P1: identifying at least one empty region in a design layer used to form the IC (e.g., an input design layer). This process can include analyzing design layer data 30 using conventional IC analysis software to locate at least one empty region within the design layer represented by design layer data 30. For example, an empty region can include a region without any line, via, connection or other active device within the design layer (e.g., an area acting as a space between active devices).

Decision D2 (following process P1, according to various embodiments): determining whether the at least one empty region requires a dense fill object (e.g., a dense fill object selected from the group of fill objects 60). This process can include placing fill objects in one or more (e.g., most, or all) of the empty regions such as to equalize the density of shapes across a given design layer (design layer data 30). The process can further include estimating a local density of shapes in the input design layer (design layer data 30) adjacent to the one of the empty regions and adding fill (or dummy) objects (e.g., fill objects 60) in the empty region such that the density of added fill objects (e.g., fill objects 60) is similar to the density of the adjacent input design layer (design layer data 30).

Process P3 (following Decision D2, according to various embodiments): As shown in FIG. 2, where the at least one empty region does not require a dense fill object 60 (No to Decision D2), the process includes placing large-scale dummy shapes in the design layer without concern for particular fill objects/dimensions, according to conventional approaches. However, for critical design layers such as the active design layer, gate design layer, via design layer and/or metal design layer, advanced technology demands that dummy shapes have the same size and density as the design shapes. As such, the answer to Decision D2 is Yes in case of all such critical layers. For non-critical layers with large design shapes, the answer to Decision D2 would be No, and larger-scale dummy shapes can be placed in empty areas as described herein.

Process P4 (following Decision D2, according to various embodiments): in response to determining that the at least one empty region requires a fill object 60 (Yes to Decision D2), this process can include placing at least one fill object 60 in the at least one empty region and tagging the fill object(s) 60. In some cases, the placing of the fill object 60 includes swapping a cell representing the at least one empty region with a cell representing the at least one fill object. In various embodiments, the at least one fill object 60 placed in the at least one empty region has not undergone OPC. In some cases, the at least one fill object 60 includes at least one object having a similar size (e.g., +/−10%) as the adjacent object in that input design layer (design layer data 30).

Process P5 (following Process P4, according to various embodiments): performing a simplified optical proximity correction (OPC) on the tagged fill object(s) and a complete OPC on the design layer data 30. This process can include performing conventional OPC on the (input) design layer data 30, while performing a separate, and in some cases, parallel process of 'simplified OPC' on the tagged fill objects 60. In some cases, the simplified OPC is performed using at least one of an optical model, resist model and/or etch model used for performing OPC on design layer data 30 and by using simplification of at least one of the OPC algorithm parameters such as: iteration count, fragmentation size and/or inclusion or omission of one or more sub-resolution assist features (SRAFs). In another embodiment simplified OPC is performed using a simplified form of at least one of the optical model, resist model and/or etch model on design layer data 30. As used herein, a "simplified form" of OPC (or other modelling discussed herein) is an optical model, resist model and/or etch model developed with simple functions and convergence conditions. For example, this model could include a constant threshold model which only assumes that a photoresist is exposed if light intensity is above a certain pre-determined threshold value. Such a model would not be sufficient to perform OPC for design features in advanced nodes.

Process P6 (following Process P5, according to various embodiments): generating a modified design layer 70 including a proximity corrected version of the input design layer data 30 and modified fill objects after the performing of the simplified OPC on the tagged at least one fill object and the complete OPC on the design layer data 30. This can include editing the design layer data 30 according to the results of the OPC processes (complete and simplified), and inserting modified fill objects 60 as designated by OPC to form modified design layer 70.

It is understood that processes P1-P6 can be iterated, as shown in FIG. 2, according to various embodiments, e.g., in order to examine, modify, etc. a plurality of empty regions within an input design layer data 30 (and modify that design layer data 30), and/or a plurality of design layers 30.

Figure 3:
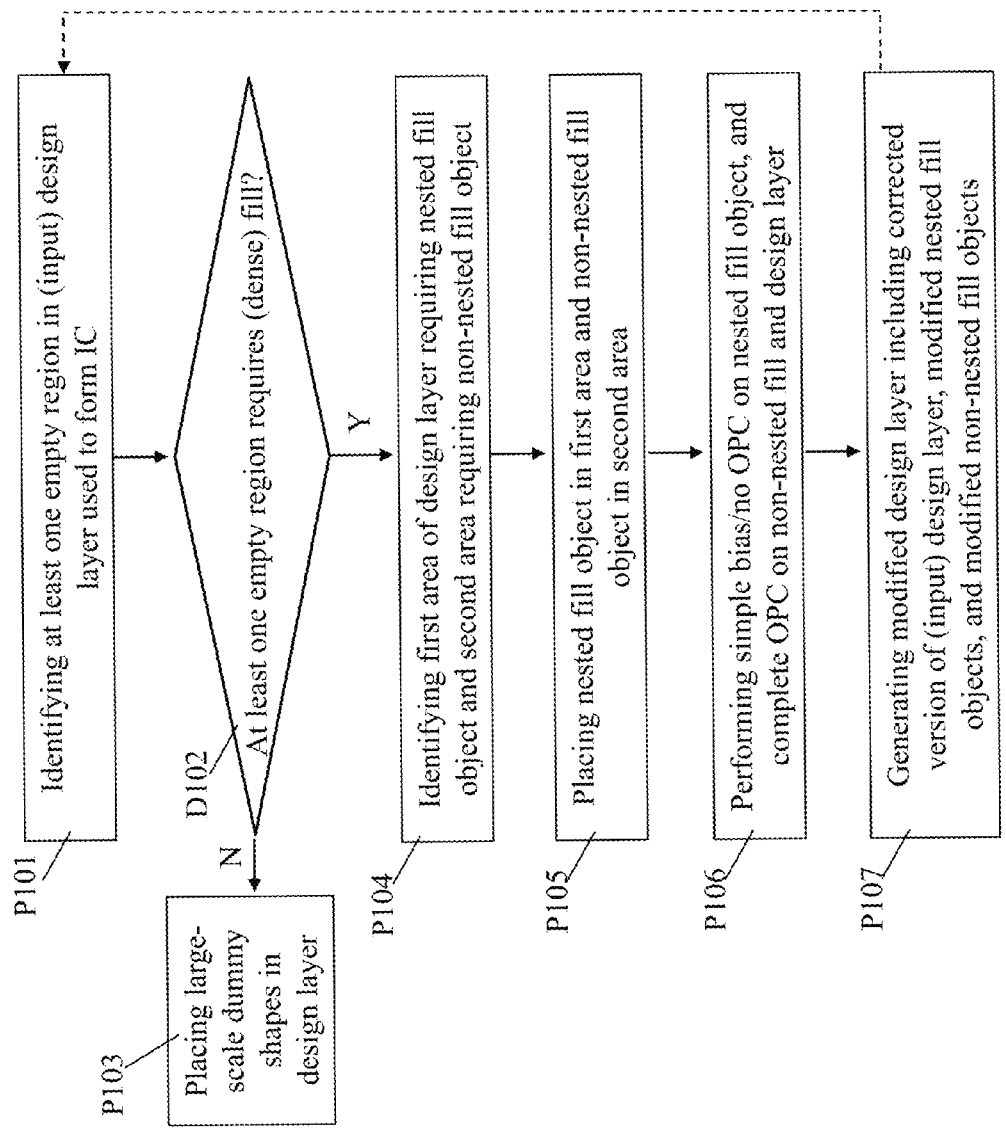
FIG. 3 shows a flow diagram illustrating a method performed according to particular embodiments of the disclosure.

FIG. 3 shows an additional flow diagram illustrating processes according to other embodiments. These processes can include:

Process P101: identifying at least one empty region in a design layer data 30 used to form the IC (e.g., an input design layer). This process can be performed substantially similarly as described with respect to FIG. 2.

Decision D102 (following process P1, according to various embodiments): determining whether the at least one empty region requires a fill object 60. This process can be performed substantially similarly as described with respect to FIG. 2.

Process P103: (following Decision D2, according to various embodiments): As shown in FIG. 2, where the at least one empty region does not require a fill object 60 (No to Decision D2), the process includes placing large-scale dummy shapes in the design layer without concern for particular fill objects/dimensions, according to conventional approaches.

Process P104: Where the at least one empty region requires the fill object (Yes to Decision D2), the process can include identifying a first area of the design layer data 30 requiring a nested fill object and a second (distinct) area of the input design layer data 30 requiring a non-nested fill object. A nested fill object, as used herein, is a fill object 60 which matches its neighboring (adjacent) fill object 60. That is, a nested fill object is "self-similar", meaning it is a replica of the object which it neighbors, to form a repeating pattern within the design layer data 30. Non-nested fill objects are those which are dissimilar in size and/or shape with their neighboring (adjacent) fill object 60, and are commonly located at the edges of empty regions or in smaller regions between existing objects 60. A nested fill object may be required as opposed to a non-nested object where an area (e.g., first area of empty region) is larger than a single fill object, while a non-nested fill object may be required where an area has an irregular shape that is smaller than a single nested fill object.

Process P105: placing the nested fill object (e.g., fill objects 60) in the first area and the non-nested fill object (e.g., fill object 60) in the second area. This process can include inserting the nested and non-nested fill objects in the corresponding empty spaces in design layer data 30.

Process P106: performing one of a simplified optical proximity correction (OPC) or no OPC on the nested fill object, and a complete OPC on the non-nested fill object and the design layer. In some cases, the simplified OPC is performed using at least one of an optical model, resist model and/or etch model used for performing OPC on design layer data 30, and by using simplification of at least one of the OPC algorithm parameters such as iteration count, fragmentation size and/or inclusion or omission of SRAFs.

In another embodiment simplified OPC is performed using a simplified form of at least one of the optical, resist and/or etch models used for performing the OPC on design layer data 30.

Process P107: generating a modified design layer including a proximity corrected version of the design layer and modified nested fill objects and non-nested fill objects after performing of the simple bias or no OPC on the nested fill object and the complete OPC on the non-nested fill object and the design layer. This can include editing the design layer data 30 according to the results of the OPC processes (complete and simplified), and inserting fill objects 60 as designated by OPC to form modified design layer 70.

It is understood that processes P101-P107 can be iterated, as shown in FIG. 3, according to various embodiments, e.g., in order to examine, modify, etc. a plurality of empty regions within an input design layer data 30 (and modify that design layer data 30), and/or a plurality of design layers 30.

Figure 4:
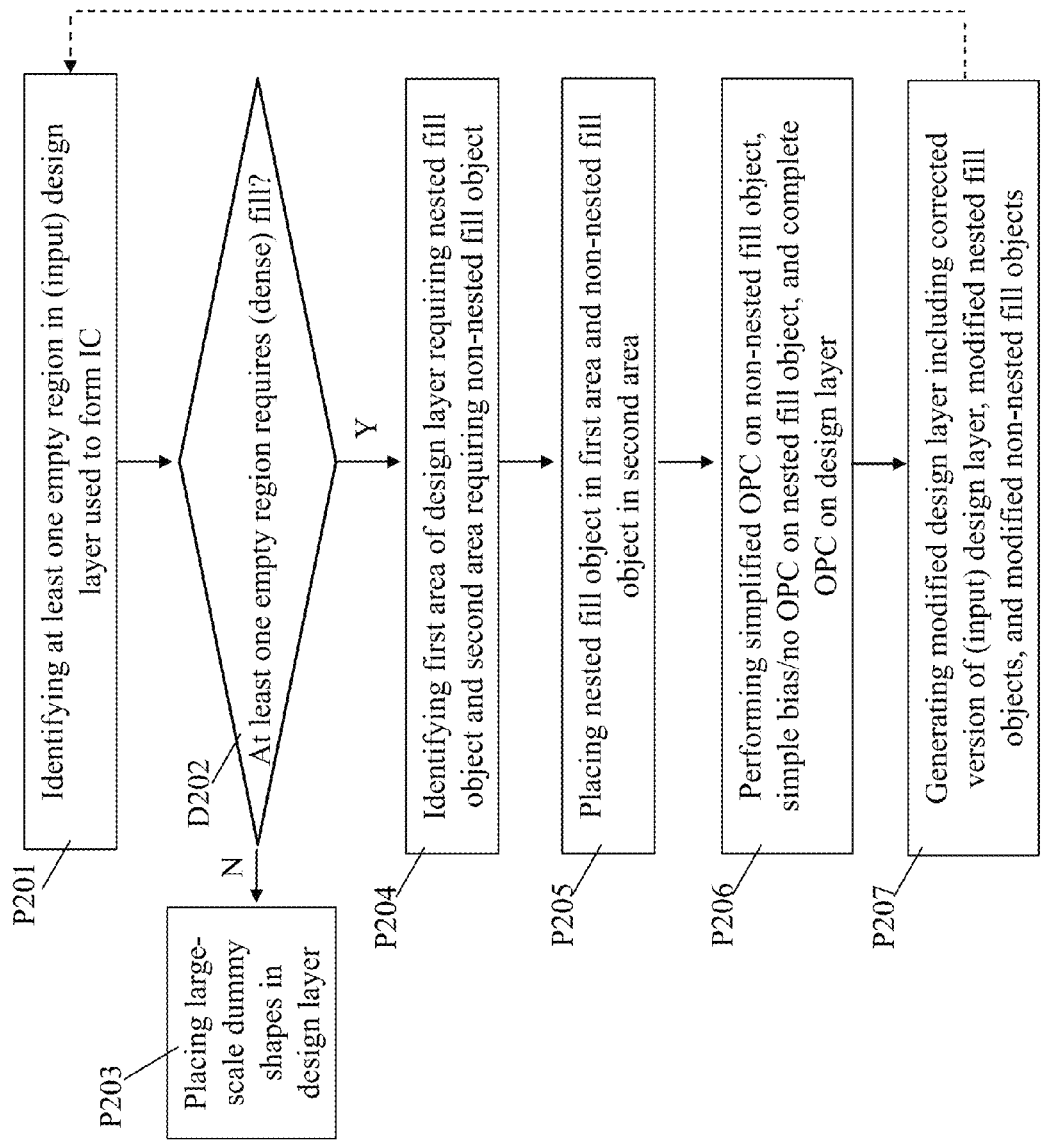
FIG. 4 shows a flow diagram illustrating a method performed according to particular embodiments of the disclosure.

FIG. 4 shows an additional flow diagram illustrating processes according to other embodiments. These processes can include:

Process P201: identifying at least one empty region in a design layer data 30 used to form the IC (e.g., an input design layer). This process can be performed substantially similarly as described with respect to FIG. 2.

Decision D202 (following process P1, according to various embodiments): determining whether the at least one empty region requires a fill object 60. This process can be performed substantially similarly as described with respect to FIG. 2.

Process P203: (following Decision D2, according to various embodiments): As shown in FIG. 2, where the at least one empty region does not require a fill object 60 (No to Decision D2), the process includes placing large-scale dummy shapes in the design layer without concern for particular fill objects/dimensions, according to conventional approaches.

Process P204: Where the at least one empty region requires the fill object (Yes to Decision D2), the process can include identifying a first area of the design layer data 30 requiring a nested fill object and a second (distinct) area of the input design layer data 30 requiring a non-nested fill object.

Process P205: placing the nested fill object (e.g., fill objects 60) in the first area and the non-nested fill object (e.g., fill object 60) in the second area. This process can include inserting the nested and non-nested fill objects in the corresponding empty spaces in design layer data 30.

Process P206: performing a simplified optical proximity correction (OPC) on the non-nested fill object, either no OPC or the simplified OPC on the nested fill object, and a complete OPC on the design layer, as discussed further herein.

Process P207: generating a modified design layer including a proximity corrected version of the design layer and modified nested fill objects and non-nested fill objects after the performing of the simplified OPC on the non-nested fill object, the simple bias or no OPC on the nested fill object and the complete OPC on the design layer. This can include editing the design layer data 30 according to the results of the OPC processes (complete), and inserting fill objects 60 as designated by OPC to form modified design layer 70.

It is understood that processes P201-P207 can be iterated, as shown in FIG. 4, according to various embodiments, e.g., in order to examine, modify, etc. a plurality of empty regions within an input design layer data 30 (and modify that design layer data 30), and/or a plurality of design layers 30.

Figure 5:
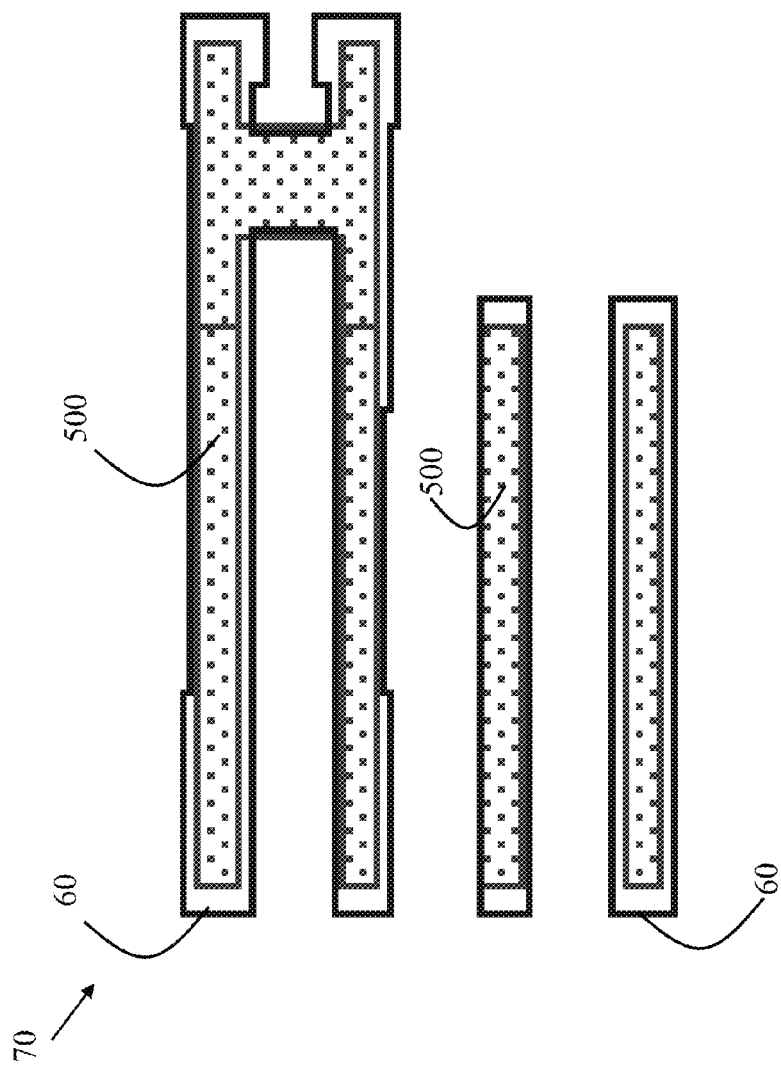
FIG. 5 shows a schematic depiction of a portion of an example modified design layer according to embodiments of the disclosure.

FIG. 5 shows a schematic depiction of a modified design layer 70 of an IC according to various embodiments. In particular, FIG. 5 shows non-nested (or, isolated) fill objects 60. As shown, simplified (OPC applied) fill objects 60 are overlaid on designed original dummy fill shapes 500. The simplified OPC is performed following the procedure described in FIG. 2.

Figure 6:
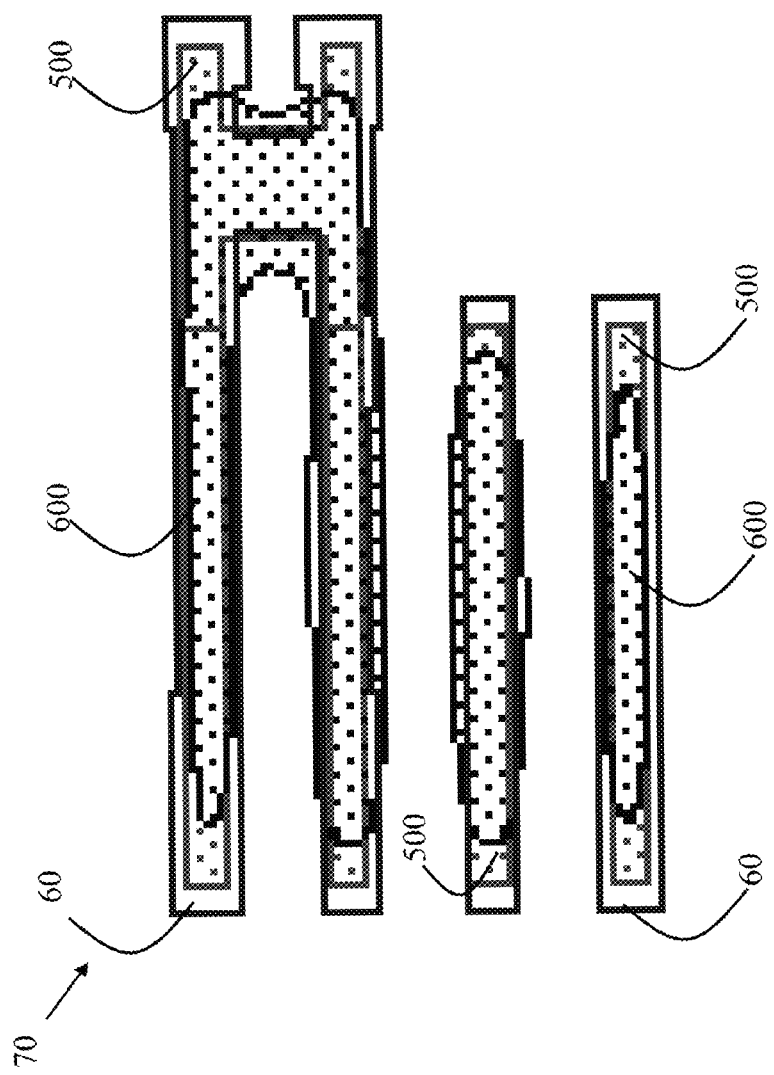
FIG. 6 shows a schematic depiction of a portion of an example modified design layer according to embodiments of the disclosure.

FIG. 6 shows a schematic depiction of a modified design layer 70 of an IC according to various embodiments, after contours 600 are overlaid on fill objects 600 according to OPC processes described herein. In particular, FIG. 6 shows non-nested (or, isolated) fill objects 60. As shown, simplified (OPC applied) fill objects 60 are overlaid on designed dummy fill shapes 500, and lithographic print image simulation contours 600 are overlaid on dummy fill shapes 500 based upon OPC. As shown in FIG. 6, the contours 600 match the targeted fill object shape given by the fill shapes 500. In this case, the (simplified OPC) non-nested fill objects 60 produce a desired structure in the design layer 70.

Figure 7:
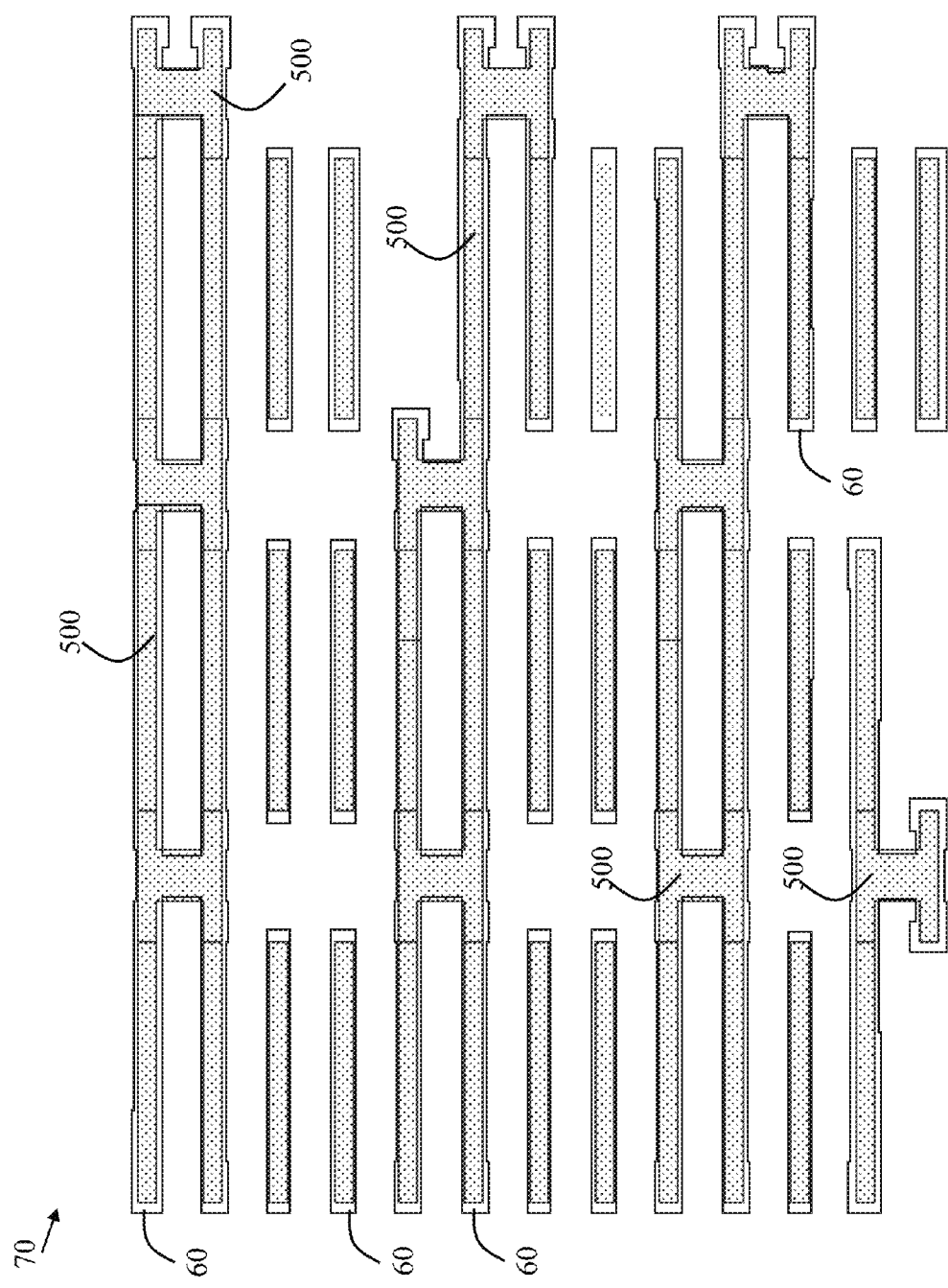
FIG. 7 shows a schematic depiction of a portion of an example modified design layer according to embodiments of the disclosure.
Figure 8:
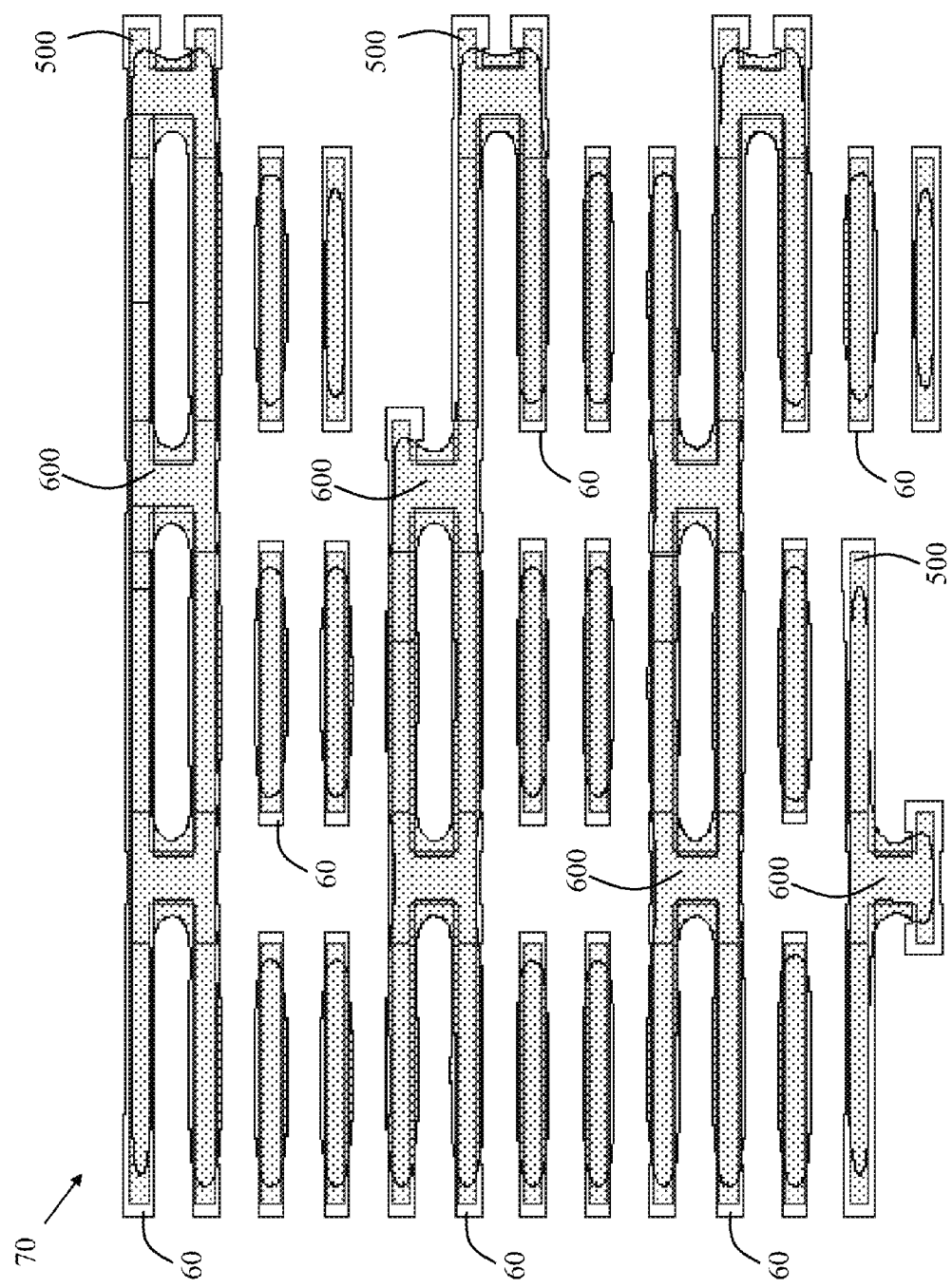
FIG. 8 shows a schematic depiction of a portion of an example modified design layer according to embodiments of the disclosure.

FIGS. 7 and 8 show similar processes as illustrated in FIGS. 5 and 6, respectively, where FIGS. 7 and 8 illustrated modified design layer 70 including nested fill objects (where FIGS. 5 and 6 show non-nested fill objects).

Figure 9:
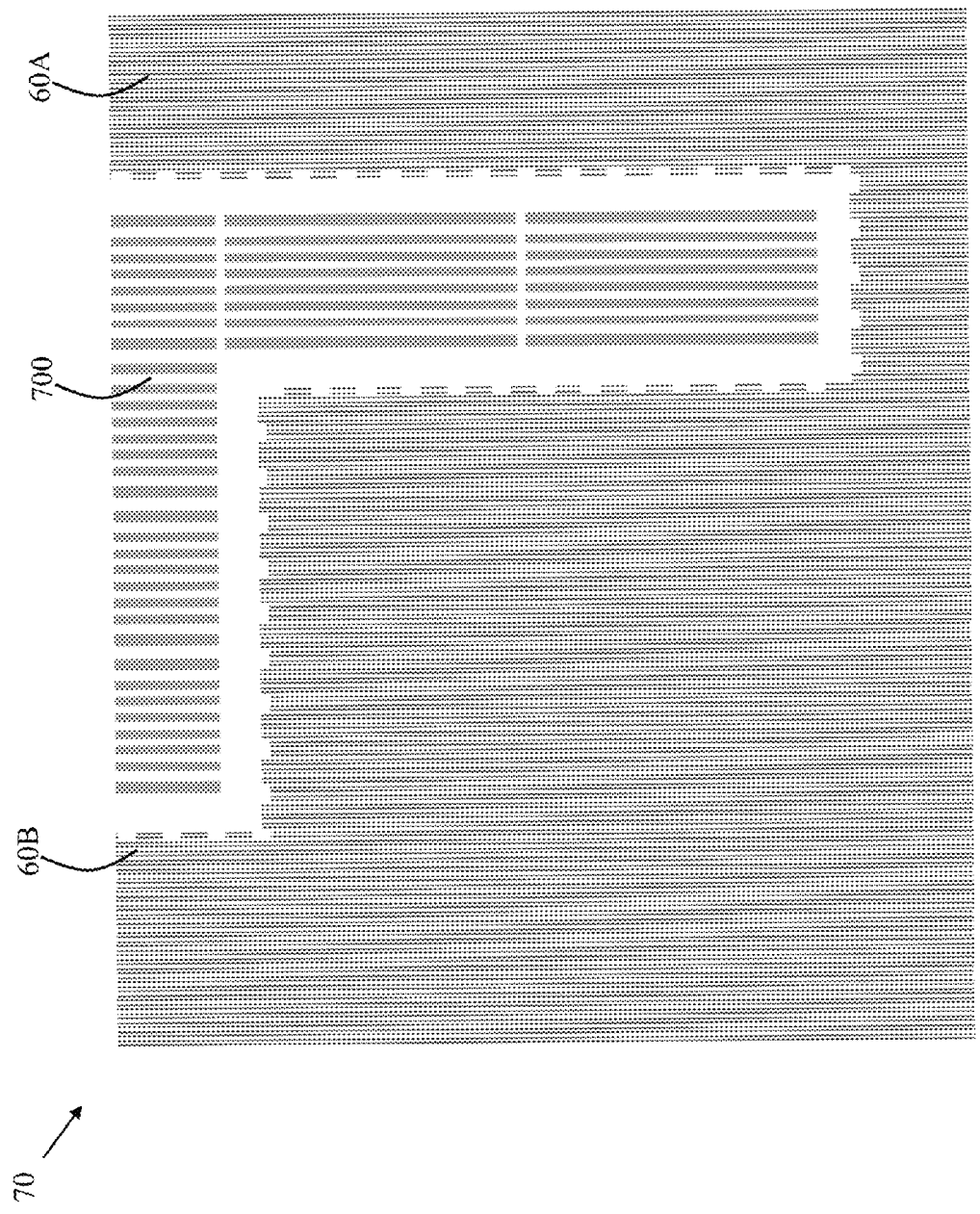
FIG. 9 shows a schematic depiction of a portion of an example modified design layer according to various additional embodiments of the disclosure.
Figure 10:
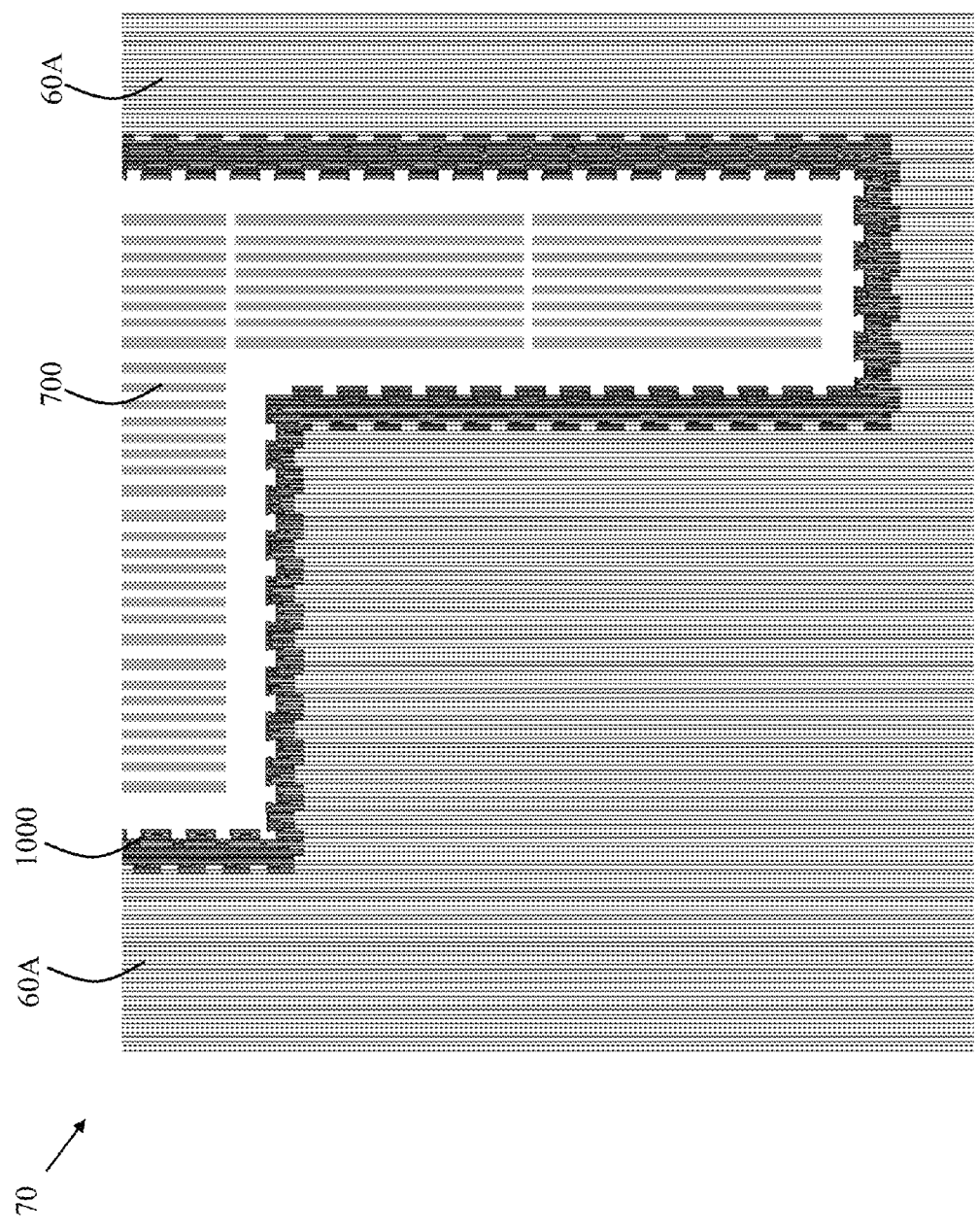
FIG. 10 shows a schematic depiction of a portion of an example modified design layer according to various additional embodiments of the disclosure.

FIG. 9 shows a close-up depiction of another modified design layer 70 according to various embodiments, including both nested fill objects (60A) and non-nested fill objects (60B) surrounding functional IC features 700 (e.g., wires, contacts, etc.). FIG. 10 shows another close-up depiction of a modified design layer 70 according to various embodiments, including nested fill objects 60A surrounding functional IC features 700. Also shown in FIG. 10 are mask shapes 1000 obtained after applying complete OPC (in a similar OPC procedure as used for functional IC features 700), associated with non-nested dummy features surrounding functional IC features 700. In this embodiment, OPC is not applied on nested fill objects 60A. As such, the modified design layer 70 is obtained following the process described with respect to the flow diagram shown in FIG. 3.

Figure 11:
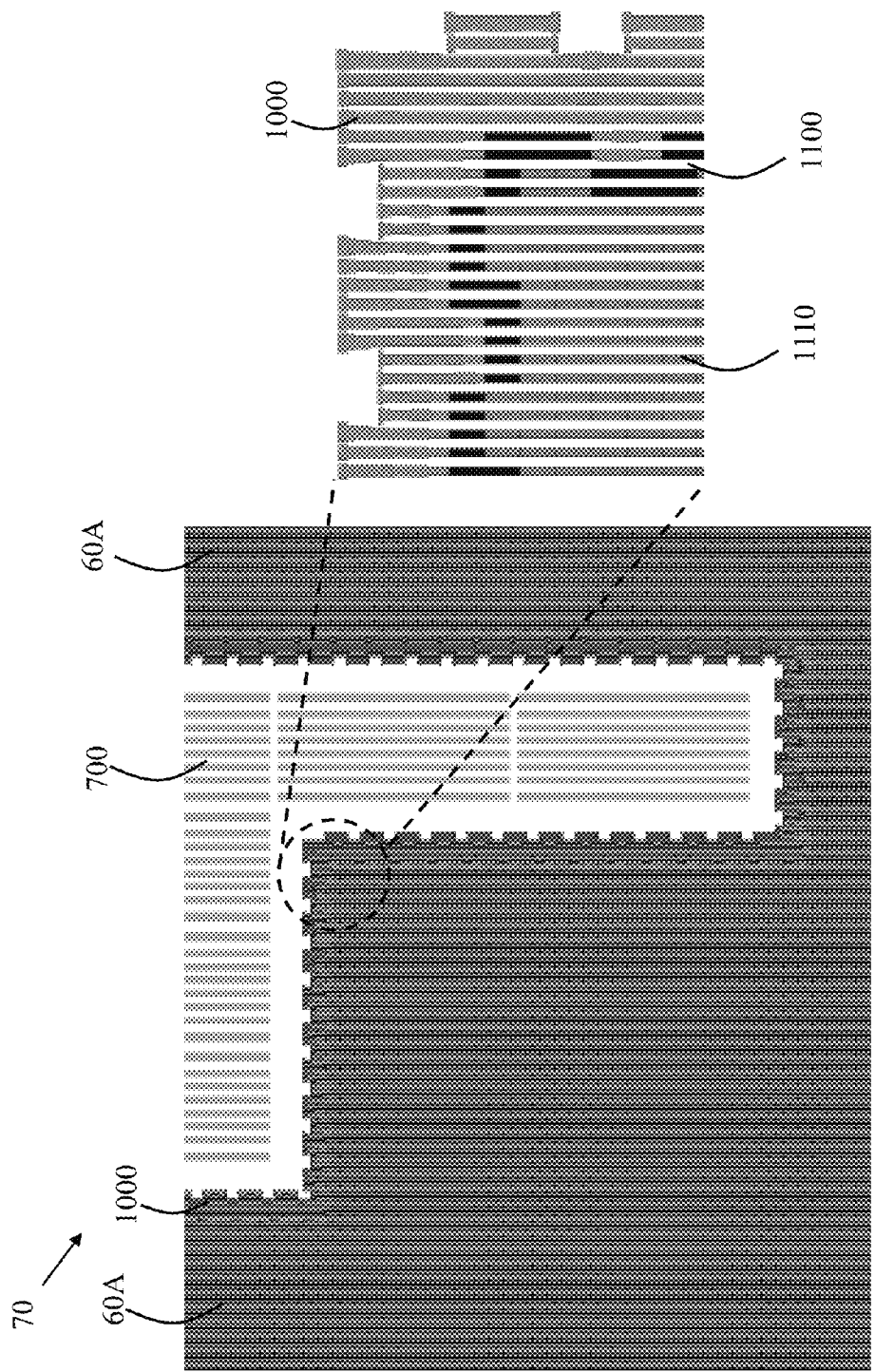
FIG. 11 shows a schematic depiction of a portion of an example modified design layer according to various additional embodiments of the disclosure.

FIG. 11 shows a schematic close-up depiction (including zoom-in) of a modified design layer 70 according to various embodiments, illustrating in particular the merging of nested fill objects 60A and non-nested fill objects 60B (in merge area 1100, shown via zoom-in). Self-similar mask build objects (or nested fill objects) 1110 are shown surrounding mask shapes 1000 and functional IC features 700. These self-similar mask build objects 1110 are similar to original nested fill objects 60A obtained without OPC, or with simple bias. The surrounding mask shapes 1000 are obtained by applying complete OPC (similar OPC procedure as used for functional IC features 700) on non-nested fill objects 60B. As seen in the merge area 1100 proper merging (without jogs, discontinuities, size mismatch etc.) of self-similar mask build objects 1110 and complete OPC applied mask shapes 1000 is obtained. This is one particular example of the process described in FIG. 3, but can be applied to any other dummy fill objects known in the art.

It is understood that in the flow diagrams shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A system comprising:
   at least one computing device configured to modify a design layer of an integrated circuit (IC) by performing actions including:
   identifying at least one empty region in the design layer used to form the IC;
   determining whether the at least one empty region requires a fill object;
   placing at least one fill object in the at least one empty region in response to determining the at least one empty region requires a fill object;
   performing a simplified optical proximity correction (OPC) on the at least one fill object and a complete OPC on the design layer,
   wherein the simplified OPC is performed using at least one of an optical model, a resist model or an etch model, and wherein the simplified OPC is performed in parallel with the complete OPC; and
   generating a modified design layer including a corrected version of the design layer and modified fill objects after the performing of the simplified OPC on the at least one fill object and the complete OPC on the design layer.

2. The system of claim 1, wherein the placing includes swapping a cell representing the at least one empty region with a cell representing the at least one fill object.

3. The system of claim 1, wherein the at least one fill object placed in the at least one empty region has not undergone OPC.

4. The system of claim 3, wherein the performing of the simplified OPC and the complete OPC is performed after the placing of the at least one fill object in the at least one empty region.

5. The system of claim 4, wherein the at least one fill object has a dimension requiring proximity correction in order to print on a wafer with desired dimensions.

6. A system comprising:
   at least one computing device configured to modify a design layer of an integrated circuit (IC) by performing actions including:
   identifying at least one empty region in the design layer used to form the IC;
   determining whether the at least one empty region requires a fill object;
   placing at least one fill object in the at least one empty region in response to determining the at least one empty region requires a fill object;
   performing a simplified optical proximity correction (OPC) on the at least one fill object and a complete OPC on the design layer,
   wherein the at least one fill object placed in the at least one empty region has not undergone OPC, wherein the performing of the simplified OPC and the complete OPC is performed after the placing of the at least one fill object in the at least one empty region, wherein the at least one fill object has a dimension requiring proximity correction in order to print on a wafer with desired dimensions, and wherein the simplified OPC is performed using at least one of: an optical model, a resist model or an etch model; and
   generating a modified design layer including a corrected version of the design layer and modified fill objects after the performing of the simplified OPC on the at least one fill object and the complete OPC on the design layer.

7. The system of claim 6, wherein the placing includes swapping a cell representing the at least one empty region with a cell representing the at least one fill object.

8. A system comprising:
   at least one computing device configured to modify a design layer of an integrated circuit (IC) by performing actions including:
   identifying at least one empty region in the design layer used to form the IC;
   determining whether the at least one empty region requires a fill object;
   placing at least one fill object in the at least one empty region in response to determining the at least one empty region requires a fill object;
   performing a simplified optical proximity correction (OPC) on the at least one fill object and a complete OPC on the design layer, wherein the simplified OPC is performed in parallel with the complete OPC, wherein the simplified OPC is performed using at least one of: an optical model, a resist model or an etch model; and
   generating a modified design layer including a corrected version of the design layer and modified fill objects after the performing of the simplified OPC on the at least one fill object and the complete OPC on the design layer.

* * * * *